United States Patent [19]

Divecha et al.

[11] Patent Number: 4,578,287
[45] Date of Patent: Mar. 25, 1986

[54] PROCESS FOR PRODUCING GRAPHITE FIBER/ALUMINUM-MAGNESIUM MATRIX COMPOSITES

[75] Inventors: Amarnath P. Divecha, Falls Church; Subhash D. Karmarkar, Great Falls, both of Va.; John V. Foltz, Camp Spring, Md.

[73] Assignee: The United States of America as represented by the Secretary of the Navy, Washington, D.C.

[21] Appl. No.: 658,930

[22] Filed: Oct. 9, 1984

[51] Int. Cl.⁴ .............................................. C23C 16/06
[52] U.S. Cl. .................................... 427/250; 427/309; 427/328; 427/357; 427/360; 427/370
[58] Field of Search .............. 427/250, 367, 177, 360, 427/178, 357, 255, 369, 299, 404, 309, 314, 359, 328, 370; 428/367, 608, 614, 408; 148/400

[56] References Cited

U.S. PATENT DOCUMENTS

| | | | |
|---|---|---|---|
| 3,473,900 | 10/1969 | Sara | 428/608 |
| 3,535,093 | 10/1970 | Sara | 428/608 |
| 3,860,443 | 1/1975 | Lachman et al. | 428/614 |
| 3,890,690 | 6/1975 | Li | 428/614 |
| 3,894,863 | 7/1975 | Lachman et al. | 148/400 |
| 4,132,828 | 1/1979 | Nakamura et al. | 428/608 |
| 4,157,409 | 6/1979 | Levitt et al. | 428/608 |

OTHER PUBLICATIONS

Jackson et al., "Tensile and Flexural Properties of Carbon Fibre-Aluminum Matrix Composites", Fibre and Science Technology, vol. 5, pp. 219–236, 1972.

Yoshida et al., "Studies on Ion-Plating Process for Making Carbon Fibre Reinforced Aluminum and Properties of the Composites", 24th Sampe Symposium, San Francisco, Calif., vol. 24, May 1979.

*Primary Examiner*—Sadie L. Childs
*Attorney, Agent, or Firm*—Robert F. Beers; Kenneth E. Walden

[57] ABSTRACT

A method of treating a commercially available ion plated graphite/aluminum composite with suitable hydroscopic liquid selected from the group consisting of methylene chloride, toluene, xylene and where such liquid treatment results in capillary action in the graphite fibers and subsequently heat treating the graphite/aluminum composite in a hot processing step where magnesium powder is sublime at a temperature in the range of 350°–450° C. and where such sublime magnesium vapor uniformly coats graphite and aluminum in the composite material so as to obtain a graphite aluminum composite coated with magnesium.

7 Claims, 1 Drawing Figure

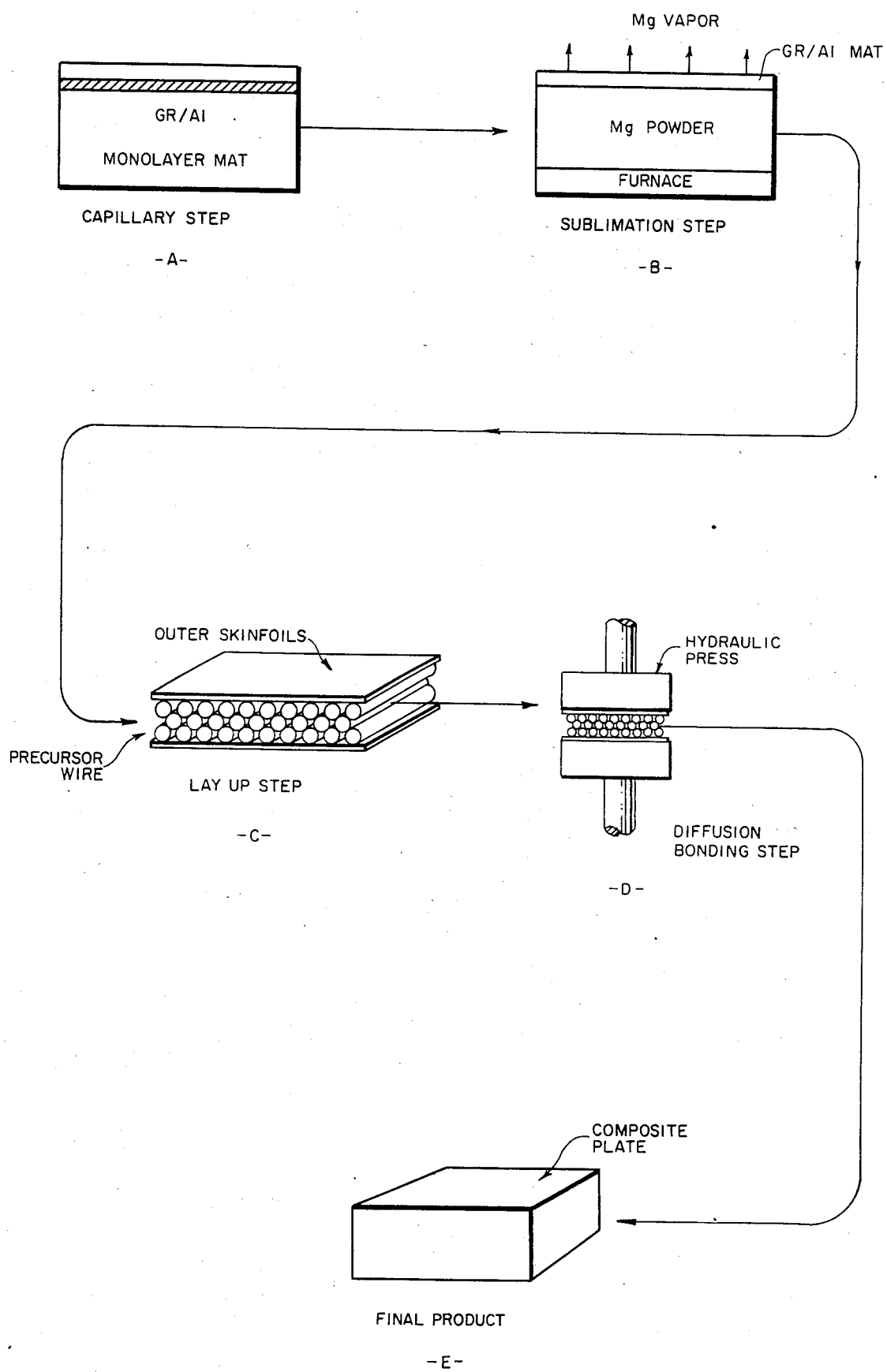

PROCESS FOR PRODUCING GRAPHITE FIBER/ALUMINUM-MAGNESIUM MATRIX COMPOSITES

BACKGROUND OF THE INVENTION

The present invention relates generally to, an improved composite material comprised of a graphite fiber/aluminum matrix composite. More particularly the graphite fiber/aluminum matrix (hereinafter referred to as Gr/Al composites of this invention have been found to have marketly improved properties when coated with magnesium (Mg) vapor.

Advanced composite materials have in the past derived their usefulness and unique properties by incorporating high strength filaments, fibers or whiskers used as a reinforcement element in a metal matrix. These elements impart stiffness to the matrix. Through the combined behavior of the two constituents these genetic composite materials exhibit specific mechanical properties exceeding those of classical structural materials. Additional properties include higher service temperature capability and improved dimensional stability. With time these act as drivers for metal matrix composites usage.

Some metal matrix composite systems have very important properties, such as high temperature and high strength. Such a composite is the graphite fiber reinforced aluminum (Gr/Al). This composite has a great deal of potential usage in aero-space applications that requires improved strength to density and modulus-to-density ratios as compared to materials such as steel, aluminum and copper.

Several methods of Gr/Al composite fabrication have been attempted using liquid metal infiltration precursor wire.

For example in recent years electroplating and liquid infiltration as disclosed in Lachman et al. U.S. Pat. No. 3,894,863 has been attempted to produce Gr/Al composites.

In addition Sara U.S. Pat. No. 3,473,900 discloses tantalum coated carbonographite fibers bonded in an essentially aluminum matrix. In this system tantalum is used as a wetting agent.

U.S. Pat. No. 3,535,093 also issued to Sara and was drawn to and discloses the electro plating of silver on carbon fibers and then incorporates them into an aluminum matrix. This patent did not disclose graphite aluminum composites.

In recent developments, a chemical vapor deposition technique disclosed by Jackson, Braddock and Walker in the "Fiber Science Technology" volume 5, 1972—pages 219 to 236 is one method that has showed some promise in the production of composites of the graphite/magnesium type. In addition powder coating, plasma spraying, and sandwiching of foils have been attempted in the United States to produce Gr/Al composites. The only method among those attempted that has shown some potential of commercial success is the coating of graphite fiber yarn with titanium diboride by chemical vapor deposition followed by the liquid infiltration of aluminum. This process is disclosed by Praprocki in the carbon fiber reinforced metal matrix. *Second conference on composites* May 1978.

This process is quite limited, in that it requires an inert atmosphere throughout the entire process. The composite produced had a low transverse strength and demanded coating with additional aluminum foil before diffusion bonding to produce the final plates of Gr/Al composite.

Recently an ion-plating technique was used in Japan to produce a Gr/Al monolayer precursor tapes. These tapes were stacked together and hot pressed into plates by the Japanese. The composites produced had properties comparable to those prepared using the United States wire technology.

The Japanese produced a IPG/Al precursor product.

The IPG/Al monolayer precursor tape spools were obtained from Celeanese Corporation, Summit, N.J. An aluminum alloy matrix used for the IPG/Al tape was reported by the Japanese manufacturer to contain 5-6 weight percent magnesium.

Generally speaking, Gr/Al composites have been either unexceptable, too expensive or have processing properties that do not conform to those required by the industry.

SUMMARY OF THE INVENTION

Accordingly, it is a primary object of the present invention to provide an improved process for preparing graphite fiber reinforced aluminum composites that are subsequently coated with magnesium vapor.

It is a more specific object of the invention to provide methods of fabricating an improved Gr/Al composite by a number of novel processing steps that involves subsequent vapor deposition of magnesium (Mg) on the commercially available Gr/Al composite that has been subjected to capillary action with a number of liquids.

It is still an additional object of this invention to provide an improved Gr/Al composite coated with vapor deposited magnesium.

Still another object is to provide a composite material containing a great number of graphite fibers that are of uniform thickness, as to both fibers and the overall mat and is superior to any prior art Gr/Al composite.

It is one additional object of the invention to provide a method for vapor coating magnesium on a previously treated Gr/Al precursor where the handling of mats is considerably less time consumming and less expensive than practiced in prior art methods.

It is still one further object to provide a method for densification of a Gr/Al precursor material where densification occurs at an increased rate and becomes complete at much lower temperatures and pressures than that practiced in the prior art processes.

It is a still further object of the invention to utilize an ion plated (IPG/Al) precursor material cut into mats and to process such precursor material by a series of steps that includes capillary treatment of the graphite fibers followed by magnesium powder sublimation to produce an improved Gr/Al composite coated with magnesium via a sublimation vapor process.

One further object is to treat a commercially avaiable ion plated Gr/Al composite with a liquid to accomplish capillary action in the graphite fibers. This step is followed by a magnesium coating step.

Briefly, in accordance with an exemplary process illustrating the concepts and principles of the present invention the above objects and the advantages are achieved by performing the steps of first rolling or otherwise disturbing the oxide layer on a commercially available ion-plated precursor containing (IPG/Al and or Gr/Al) with subsequent treatment with a liquid in a capillary step followed immediately by sublimation of the product in a furnace with magnesium vapor that may be subsequently followed by conventional rolling, layup and hot pressing step in a hydraulic press and than a diffusion bonding step to produce an improved composite product.

BRIEF DESCRIPTION OF THE DRAWING

The drawing, FIG. 1 illustrates a schematic series of steps for treating and fabricating a commercial ion-plated Gr/Al composite.

The above and still further objects, features and advantages of the present invention will become apparent from a consideration of the sole FIGURE in which there is shown a schematic view of the typical liquid treatment step, that represents capillary action within the graphite fibers followed by magnesium sublimation in the process of the invention.

DESCRIPTION OF THE PREFERRED EMBODIMENT

In the processees to be described references made to certain specific materials as suitable for use in the processing of a known commerically available ion-plated Gr/Al precursor tape.

The ion-plated Gr/Al precursor that is a precursor or starting material in this invention is the material made by Yoshida, M., Ikegami, S. Ohsaki, T., and Ohkita, T. That is describing a publication entitled "Studies on Ion-Plating Process for Making Cabon Fiber Reinforced Aluminum and Properties of the Composites". Presented to the Proceedings, 24th SAMPE Symposium, San Francisco, Calif., Volume 24, p. 1407, May 1979. This material was obtained by the inventors from Celanese Corporation one of the agents in the United States for the sale of ion-plated Gr/Al tapes and mats.

In the commercially availble ion-plated Gr/Al precursor tape the graphite fibers will usually vary between 20 and 40% by weight and a number of ends of these graphite fibers would generally be in a range of 3000 to 3500 per inch or per mat. The diameter of the graphite fibers usually fall in the range of from 0.2 to 0.3 mils. The fibers may be generally circular or ellipitical in cross sectional shape.

In the first preferred embodiment, the ion-plated Gr/Al precursor tape has a number of folded ends of graphite fibers that can be beneficially treated with a hydroscopic liquid selected from the group consisting of methylene chloride, toluene, benzene and heptane. Any other liquid that will be completely driven off at room temperatures can be substituted except compounds containing water. Liquid compounds that contain water should be avoided.

In the capillary step demoninated as step A in FIG. 1 the mono layer mat of Gr/Al that is an ion plated composite is treated with a liquid from the above group of liquids, preferably methylene chloride or toluene at a temperature ranging from 10° C. to 30° C., and at atmospheric pressure. By capillary action, that is well known in the scientific community the carbon fibers will absorb liquid, become more dense, expand in volume and assume a straight shape in the composite.

In step B shown in FIG. 1 of the drawing the previously treated ion-plated Gr/Al composite with the carbon-graphite fibers is subjected to a magnesium sublimation process. Powdered magnesium is heated to form a vapor. The magnesium vapor is deposited on the Gr/Al composite while the graphite fibers are liquid laden.

Applicants point out that any commerically available Gr/Al precursor can be beneficially treated by sublimation with magnesium powder so that magnesium vapor coats each fiber. It is applicants intention to claim the product of this step alone as a novel useful product. Even though the product is greatly improved by a prior treatment with suitable liquid so as to allow capillary action in each an every fiber that aligns the fibers in the mat or tape.

In step C the magnesium coated Gr/Al mat is sandwiched between two aluminum foils in a lay-up step. The lay-up step designated as C places a mat in position to further rolled and compacted together.

In step D, that is denominated a diffusion bonding step the layed up material comprising a mat of magnesium coated Gr/Al is pressed in a conventional hydraulic pressing machine at a temperature in a range of from about 400° to 500° C. The preferred range is 420° to 450° C. under a pressure of 500 to 1000 PSI. Aluminum and magnesium form a eutectic alloy close to 450° C. a small amount of liquid was generated. After pressing, the pressure and temperature were maintained for about 10 minutes or so to fully homogenize the aluminum magnesium matrix. The composite plate was then removed from the hydraulic press die.

A rolling step in a conventional roll mill may optionally preceed step A in the FIG. 1. This cold rolling step may be done in a rolling mill at room temperature.

EXAMPLE

A three inch wide by six inch long ion plated GR/Al mat was cut from a commercially supplied spool (Celloese Corp.). These mats were then individually rolled using a small experimental rolling mill giving it about (0.125) 1/8% cold reduction. This operation removed the aluminum oxide skin on the mat's surface. The mats were then dipped in methylene chloride liquid, the capillary action caused the folds to merge and become closed packed automatically.

The composite matrix mat was then placed over a can containing Mg powder ($-325$ mesh). The can was heated by a small laboratory furnace to a temperature of about 380° C. The magnesium sublimated and coated the GR/Al mat uniformly. Each mat was coated separately.

The coated mats were sandwiched between two 6061 (0.001" thick) aluminum foils and hot pressed at 500–1000 psi at 420°–450° C. Because aluminum and magnesium formed a eutectic close to 450° C., a small amount of liquid was generated. After pressing, the pressure and temperature was maintained for about 10 minutes or so to fully homogenize the Al/Mg matrix. The composite plate was then removed from the die.

Obviously numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A method of preparing a graphite fiber/aluminum-magnesium matrix composite comprising the following steps in order:
   (1) exposing a precursor composite mat of graphite fibers which have been ion-plated with aluminum to a liquid organic compound selected from the group consisting of methylene chloride, toluene, benzene, and heptane;

(2) allowing the graphite fibers to absorb the liquid organic compound by capillary action until the graphite fibers expand in volume and become straight;

(3) removing the excess liquid organic compound from the surface of the graphite fibers;

(4) using magnesium vapor to coat the aluminum ion-plated graphite fibers with magnesium; and (5) densifying the resulting graphite fiber/aluminum-magnesium matrix composite.

2. The process of claim 1 wherein before step (1) the precursor composite mat of graphite fibers which have been ion-plated with aluminum are mill rolled to remove and disturb any oxides present and to give a fresh mat that is ready for liquid treatment.

3. The method of claim 1 wherein steps (1) and (2) are performed at a temperature in the range of from 10° C. to 30° C.

4. The method of claim 1 wherein steps (5) comprises hot pressing the graphite fiber/aluminum-magnesium matrix composite at 500 to 1000 psi at a temperature of from 420° C. to 450° C.

5. The method of claim 1 wherein the precursor composite mat in step (1) comprises from 20 to 40 weight percent of graphite fibers with the remainder of the composite being aluminum.

6. The method of claim 1 wherein the precursor composite mat used in step (1) contains from 3000 to 3500 graphite fibers per inch.

7. The method of claim 6 wherein the graphite fibers are from about 0.2 to 0.3 mils in diameter.

* * * * *